(12) United States Patent
'Khng et al.

(10) Patent No.: US 7,550,315 B2
(45) Date of Patent: Jun. 23, 2009

(54) METHOD FOR FABRICATING SEMICONDUCTOR PACKAGE WITH MULTI-LAYER DIE CONTACT AND EXTERNAL CONTACT

(75) Inventors: Victor Tan Cher 'Khng, Singapore (SG); Lee Kian Chai, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/781,256

(22) Filed: Jul. 22, 2007

(65) Prior Publication Data

US 2007/0262469 A1 Nov. 15, 2007

Related U.S. Application Data

(60) Continuation of application No. 10/867,530, filed on Jun. 14, 2004, now Pat. No. 7,253,022, which is a division of application No. 10/023,049, filed on Dec. 20, 2001, now Pat. No. 7,202,556.

(51) Int. Cl.
*H01L 21/44* (2006.01)

(52) U.S. Cl. ............... 438/106; 438/108; 438/127; 438/614

(58) Field of Classification Search ............ 438/127, 438/106, 108, 614
See application file for complete search history.

(56) References Cited

U.S. PATENT DOCUMENTS

| | | | |
|---|---|---|---|
| 4,494,688 A | 1/1985 | Hatada et al. | |
| 5,288,769 A | 2/1994 | Papageorge et al. | |
| 5,397,917 A | 3/1995 | Ommen et al. | |
| 5,397,921 A | 3/1995 | Karnezos | |
| 5,434,452 A | 7/1995 | Higgins, III | |
| 5,468,995 A | 11/1995 | Higgins, III | |
| 5,616,958 A | 4/1997 | Laine et al. | |
| 5,821,626 A | 10/1998 | Ouchi et al. | |
| 5,877,559 A | 3/1999 | Takayama et al. | |
| 5,956,235 A | 9/1999 | Kresge et al. | |
| 5,962,921 A | 10/1999 | Farnworth et al. | |

(Continued)

OTHER PUBLICATIONS

Ahti Aintila et al, "Electroless Ni/Au Bumps for Flipchip-on-Flex and TAB Applications", IEEE/CPMT Int'l Electronics Manufacturing Technology Symposium, pp. 160-164, 1994.

*Primary Examiner*—Michael Trinh
(74) *Attorney, Agent, or Firm*—Stephen A. Gratton

(57) ABSTRACT

A semiconductor package includes a substrate formed of a board material, a semiconductor die bonded to the substrate, and an encapsulant on the die. The package also includes an array of external contacts formed as multi layered metal bumps that include a base layer, a bump layer, and a non-oxidizing outer layer. The external contacts are smaller and more uniform than conventional solder balls, and can be fabricated using low temperature deposition processes, such that package warpage is decreased. Further, the external contacts can be shaped by etching to have generally planar tip portions that facilitate bonding to electrodes of a supporting substrate. Die contacts on the substrate can also be formed as multi layered metal bumps having generally planar tip portions, such that the die can be flip chip mounted to the substrate. A method for fabricating the package includes the step of depositing the different layers for the metal bumps using electroless and electrolytic deposition, and then etching the different layers to shape the metal bumps.

14 Claims, 6 Drawing Sheets

U.S. PATENT DOCUMENTS

| | | | |
|---|---|---|---|
| 6,013,948 | A | 1/2000 | Akram et al. |
| 6,048,755 | A | 4/2000 | Jiang et al. |
| 6,122,171 | A | 9/2000 | Akram et al. |
| 6,137,164 | A | 10/2000 | Yew et al. |
| 6,157,084 | A | 12/2000 | Hino et al. |
| 6,222,272 | B1 | 4/2001 | Takayama et al. |
| 6,281,106 | B1 | 8/2001 | Higdon et al. |
| 6,300,576 | B1 | 10/2001 | Nakamura et al. |
| 6,337,445 | B1 | 1/2002 | Abbott et al. |
| 6,362,087 | B1 | 3/2002 | Wang et al. |
| 6,365,974 | B1 | 4/2002 | Abbott et al. |
| 6,396,155 | B1 | 5/2002 | Nukiwa et al. |
| 6,403,457 | B2 | 6/2002 | Tandy |
| 6,426,875 | B1 | 7/2002 | Akram et al. |
| 6,441,495 | B1 | 8/2002 | Oka et al. |
| 6,457,632 | B1 | 10/2002 | Teshima et al. |
| 6,487,088 | B2 * | 11/2002 | Asai et al. .................. 361/794 |
| 6,534,723 | B1 | 3/2003 | Asai et al. |
| 6,586,826 | B1 | 7/2003 | Glenn et al. |
| 6,683,387 | B1 | 1/2004 | Brownfield |
| 6,720,661 | B2 | 4/2004 | Hanaoka et al. |
| 7,202,556 | B2 | 4/2007 | 'Khng et al. |
| 7,208,828 | B2 | 4/2007 | 'Khng et al. |
| 7,253,022 | B2 | 8/2007 | 'Khng et al. |
| 2001/0047880 | A1 | 12/2001 | Abbott et al. |
| 2002/0000652 | A1 | 1/2002 | Goh |
| 2002/0030245 | A1 | 3/2002 | Hanaoka et al. |
| 2002/0070438 | A1 | 6/2002 | Ference et al. |
| 2002/0076910 | A1 | 6/2002 | Pace |
| 2002/0130397 | A1 | 9/2002 | Yew et al. |
| 2003/0006503 | A1 | 1/2003 | Yoneda et al. |

\* cited by examiner

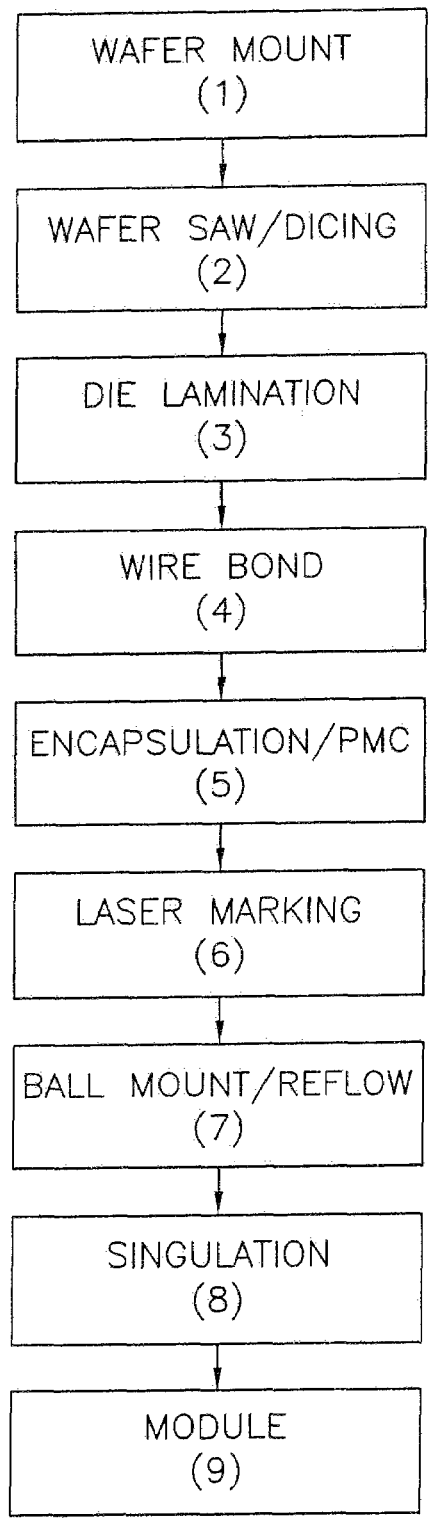
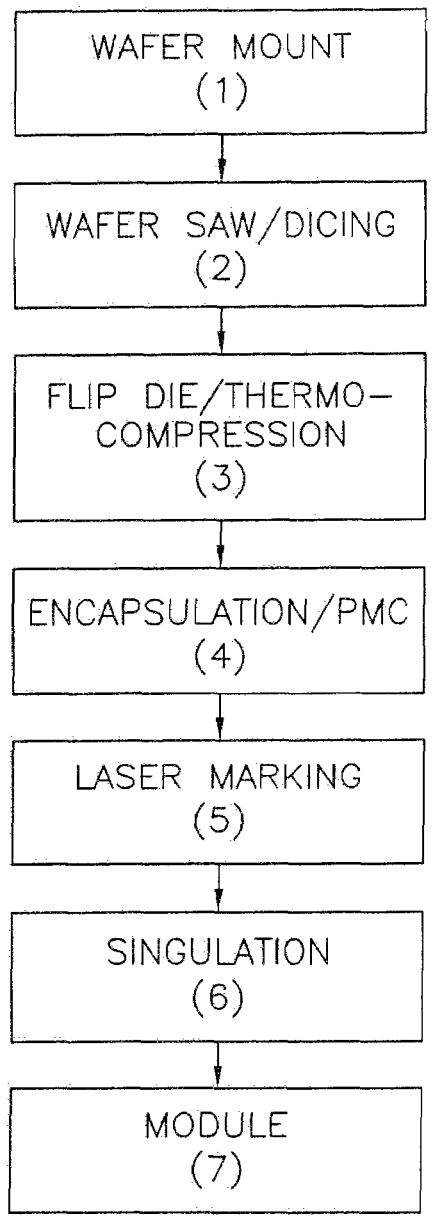
FIGURE 4A
(PRIOR ART)
FIGURE 4

METHOD FOR FABRICATING SEMICONDUCTOR PACKAGE WITH MULTI-LAYER DIE CONTACT AND EXTERNAL CONTACT

CROSS REFERENCE TO RELATED APPLICATIONS

This application is a continuation of Ser. No. 10/867,530 filed Jun. 14, 2004, U.S. Pat. No. 7,253,022, which is a divisional application of Ser. No. 10/023,049, filed Dec. 20, 2001, U.S. Pat. No. 7,202,556.

This application is related to Ser. No. 10/023,049 filed Dec. 20, 2001, U.S. Pat. No. 7,202,556 B2, and to Ser. No. 11/101,626 filed Apr. 8, 2005, U.S. Pat. No. 7,208,828 B2.

FIELD OF THE INVENTION

This invention relates generally to semiconductor packaging, and specifically to a semiconductor package that includes a substrate having external contacts, and optionally die contacts, formed as multi-layer metal bumps. This invention also relates to a method for fabricating the package, and to electronic assemblies incorporating the package.

BACKGROUND OF THE INVENTION

One type of semiconductor package is referred to as a BGA (ball grid array) package. A conventional BGA package includes a semiconductor die bonded to a substrate, and an encapsulant on the die. Typically, the substrate comprises an organic material, such as bismaleimide triazine (BT), an epoxy resin (e.g., "FR-4") or a polyimide resin. The substrate also includes a pattern of conductors, such as copper traces formed directly on the substrate, or alternately on a flexible tape attached to the substrate.

One type of BGA package is known as a BOC (board-on-chip) package. With a BOC package, the substrate (i.e., the board) is bonded to the circuit side (face) of the die, and wire bonds are made between the die contacts on the substrate and the bond pads on the die. Another type of BGA package is known as a COB (chip-on-board) package. With a COB package, the die is back bonded to the substrate and wire bonded to the die contacts on the substrate, or alternately flip chip bonded directly to the die contacts on the substrate.

The substrate also includes external contacts in electrical communication with the conductors and the die contacts. Typically, the external contacts comprise solder balls arranged in a dense array, such as a ball grid array (BGA), or a fine ball grid array (FBGA).

Referring to FIGS. 1A-1C, a conventional BGA package 10 in a COB configuration is illustrated. The BGA package 10 includes a stacked pair of semiconductor dice 12, 14, each having a pattern of bond pads 16 on a circuit side thereof. The dice 12, 14 are sized, and bonded to one another, such that the bond pads 16 are exposed for wire bonding. The bond pads 16 are in electrical communication with the integrated circuits and semiconductor devices contained on the dice 12, 14. The BGA package 10 also includes a substrate 18 and adhesives layers 20 which bond the dice 12, 14 to one another and to the substrate 18. The substrate 18 includes die contacts 22 configured for wire bonding to the dice 12, 14. Specifically, wires 24 are bonded to the bond pad 16 on the dice 12, 14 and to the die contacts 22 on the substrate.

The BGA package 10 also includes a polymer tape 28 on the substrate 18, and an array of external contacts 26 on the polymer tape 28 in electrical communication with the die contacts 22 on the substrate 18. Conductors (not shown) on the polymer tape 28 and interlevel conductors (not shown) on the substrate 18 electrically connect the external contacts 26 to the die contacts 22. Typically, the polymer tape 28 includes a flexible polymer substrate, such as polyimide, on which required circuit patterns are formed.

The external contacts 26 comprise solder balls in a grid array, such as a ball grid array (BGA) or a fine ball grid array (FBGA). The external contacts 26 are bonded to ball bonding sites 30 on the polymer tape 28 using a bonding technique such as soldering, welding or brazing. In addition, a solder mask 34 includes openings 36 (FIG. 1C) for aligning the external contacts 26 for bonding, and for electrically insulating the external contacts 26 from one another.

The BGA package 10 also includes an encapsulant 32 that encapsulates the dice 12, 14, the wires 24, and the associated wire bonds on the bond pads 16 and on the die contacts 22. Typically, the encapsulant 32 comprises a Novolac based epoxy formed in a desired shape using a transfer molding process, and then cured using an oven.

One feature of this type of BGA package 10 is that due to their size, the external contacts 26 add considerably to the thickness T (FIG. 1A) of the BGA package 10. For example, conventional solder balls typically have a diameter of from about 0.012-inch (0.3-mm) to 0.030-inch (0.762-mm). The size of the external contacts 26 also limits the density or "packing fraction" of the external contacts 26. Similarly, due to their size, the spaces between the external contacts 26 are relatively small, so that the routing of the corresponding conductors on the polymer tape 28 in the spaces is restricted.

It would be advantageous to be able to fabricate external contacts that are smaller than conventional solder balls. This would decrease the height of the BGA package 10. In addition, smaller external contacts could be spaced further apart allowing the density of the conductor pattern on the polymer substrate 28 to increase. This in turn would decrease the peripheral outline, or "footprint", of the BGA package 10.

Another problem with external contacts 26 in the form of conventional solder balls, is that the locations of the external contacts 26 may vary in the X-direction from a theoretical location (dotted lines), as indicated by $\Delta X$ in FIG. 1B, or in the y-direction as indicated by $\Delta Y$ in FIG. 1B. These variations in the locations of the external contacts 26 may be due to mask alignment and art work errors introduced during fabrication of the bonding sites 30, and during fabrication of the solder mask 34.

Another problem with external contacts 26 in the form of solder balls is that the planarity of the external contacts 26 may vary. For example, as shown in FIG. 1C, the middle external contact 26 is offset from a theoretical plane P by a distance $\Delta Z$. This planarity variation may be due to warpage of the polymer substrate 28 following the mold cure process for the encapsulant 32.

Yet another problem with external contacts 26 in the form of solder balls is illustrated in FIG. 1D. Typically the package 10 is mounted to a supporting substrate 38 (e.g., PCB), by reflowing the external contacts 26RF onto electrodes 40 on the supporting substrate 38. A solder mask 42 on the supporting substrate 38 facilitates the soldering process. However, the planarity of the external contacts 26 can adversely affect the planarity of the package 10 as indicated by the angle A of the package 10 relative to a theoretical package planarity PP (where PP is a plane generally parallel to the surface of the supporting substrate 38).

Another problem associated with external contacts 26 in the form of solder balls, is that poor quality solder joints between the external contacts 26 and the bonding sites 30 can cause opens and shorts, or can cause the external contacts 26 to separate from the bonding sites 30. Poor quality solder joints can also cause the external contacts 26 to separate from the bonding sites 30. In general, the quality of the solder joints is affected by the surface topography of the bonding sites 30 and by the thermal profile and cycling times of the bonding process. Similarly the quality of the solder joints between the reflowed external contacts 26RF (FIG. 1D) can cause opens and shorts, and planarity problems for the package 10.

In view of the foregoing improved semiconductor packages having better external contacts are needed in the art. The present invention is directed to an improved semiconductor package having multi layered external contacts, and optionally multi layered die contacts. The present invention is also directed to a method for fabricating the package, and to improved electronic assemblies incorporating the package.

SUMMARY OF THE INVENTION

In accordance with the present invention, an improved semiconductor package, a method for fabricating the package, and an electronic assembly incorporating the package are provided.

The package includes a substrate, a semiconductor die mounted to the substrate, and an encapsulant molded to the substrate encapsulating the die. The substrate comprises a conventional "board" material such as an organic polymer resin reinforced with glass fibers. In addition, the substrate includes die contacts that are placed in electrical communication with bond pads on the die using a process such as thermocompression bonding, wire bonding or TAB bonding. The substrate also includes conductors and bonding sites in electrical communication with the die contacts. The conductors and bonding sites can be formed directly on the substrate, or on a flexible polymer tape attached to the substrate.

The package also includes external contacts on the bonding sites arranged in a dense grid array, and configured as input/output ports for the package. The external contacts comprise multi layered metal bumps that include a base layer (first layer) on the bonding sites, a bump layer (second layer) on the base layer, and an outer layer (third layer) on the bump layer. The base layer comprises a metal such as copper, that adheres to the bonding sites, which can also comprise copper. The bump layer comprises a metal such as nickel, that can be easily deposited to a desired thickness on the base layer. The outer layer comprises a non-oxidizing metal, such as gold, that will bond easily to mating electrodes on a supporting substrate (e.g., PCB).

One advantage of the package is that the external contacts can be made smaller than conventional solder balls. The decreased size of the external contacts decreases the thickness of the package, and allows an increase in the density of the conductors, and thus the signal density of the package. In addition, the external contacts can be fabricated using low temperature deposition processes such as electroless and electrolytic deposition, such that package warpage is decreased. Further, the external contacts can be made more uniformly and with improved planarity over conventional solder balls. Still further, the external contacts can be shaped by etching to include a generally planar tip portion configured to bond easily to the mating electrodes on a supporting substrate.

In a first embodiment of the package, the die contacts on the substrate also comprise multi-layered metal bumps, and are bonded to the bond pads on the die with the die in a flip chip configuration. In a second embodiment of the package, a stacked die is back bonded to the substrate in a chip-on-board configuration, and is wire bonded to the die contacts. In a third embodiment of the package, the die is adhesively bonded face down to the substrate in a board-on-chip configuration, and is wire bonded to the die contacts. In a fourth embodiment of the package, a stacked die is back bonded to a recess in the substrate in contact with a heat spreader, and is wire bonded to the die contacts.

The method for fabricating the package includes the initial steps of providing the substrate, and forming the die contacts, the conductors and the bonding sites on the substrate. The die contacts, the conductors, and the bonding sites can be formed directly on the substrate, or by attaching the polymer tape with these elements thereon to the substrate. The method also includes the step of forming the external contacts by deposition of separate metal layers (base layer, bump layer, outer layer) on the bonding sites. In the embodiment wherein the die contacts also comprise multi-layer metal bumps, the die contacts and the external contacts can be fabricated at the same time. The method also includes the step of mounting the die to the substrate in electrical communication with the die contacts on the substrate. The mounting step can be performed by wire bonding, flip chip bonding or TAB bonding. In addition, the method includes the step of forming the encapsulant on the die.

The electronic assembly includes a supporting substrate, and one or more of the packages flip chip mounted the substrate. In an illustrative embodiment the electronic assembly is in the form of a multi-chip module. Because the packages have a reduced height, a height of the assembly is also reduced.

BRIEF DESCRIPTION OF THE DRAWINGS

FIG. 4 is a block diagram illustrating additional steps in the method for fabricating the package of FIG. 2A;

FIG. 4A is a block diagram illustrating steps in a prior art method for fabricating the package of FIG. 1A;

DETAILED DESCRIPTION OF THE PREFERRED EMBODIMENTS

Referring to FIGS. 2A-2D, a semiconductor package 50 constructed in accordance with the invention is illustrated. The package 50 includes a semiconductor die 52; a substrate 54 bonded to the die 52; and an encapsulant 48 encapsulating the die 52.

The die 52 includes a semiconductor substrate, such as silicon or gallium arsenide, containing integrated circuits fabricated using well known processes. The die 52 can be a conventional semiconductor component such as a dynamic random access memory (DRAM), a synchronous DRAM (SDRAM), a static random-access memory (SRAM), an erasable programmable read-only memory (EPROM), a logic circuit (LOGIC), or any other semiconductor device that requires packaging.

Figure 2A:
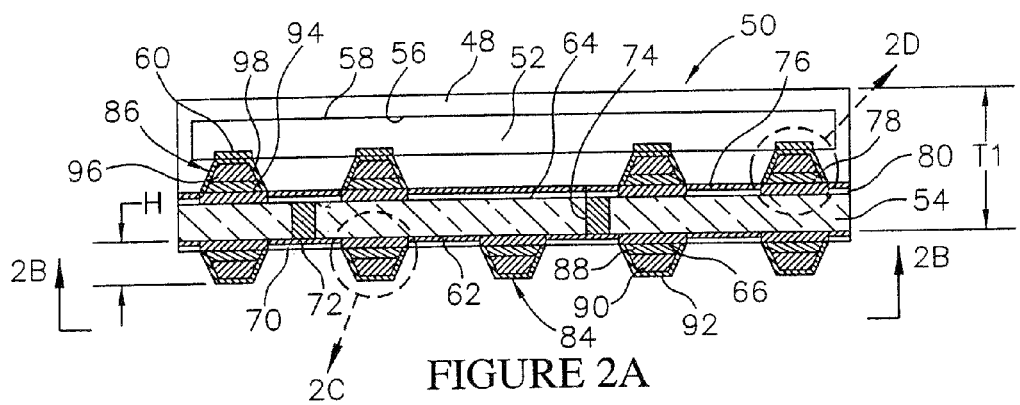
FIG. 2A is an enlarged schematic cross sectional view of a semiconductor package constructed in accordance with the invention.

As shown in FIG. 2A, the die 52 includes a circuit side 56 (face) and a back side 58. In addition, the die 52 includes a pattern of bond pads 60 on the circuit side 56 in electrical communication with the integrated circuits contained on the die 52. In the illustrative embodiment, the bond pads 60 comprise planar contacts formed of a bondable material (e.g., aluminum). However, the bond pads can comprise any type of conventional contact including bumped contacts. Also for illustrative purposes, the bond pads 60 are shown as being recessed below a passivation layer on the circuit side 56 of the die 52 as is conventional. In addition, a thickness of the die 52 can be conventional with a thickness of between about 0.2 mm and 0.5 mm being representative.

The substrate 54 for the package 50 comprises an electrically insulating material such as an organic polymer resin reinforced with glass fibers. Such a material is sometimes referred to as a "circuit board" material, such that the substrate 54 can also be referred to as a "board". Suitable materials for the substrate 54 include bismaleimide-trizine (BT), epoxy resins ("FR-4" and "FR-5"), and polyimide resins. A representative thickness of the substrate 54 can be from about 0.2 mm to 1.6 mm.

As shown in FIG. 2A, the substrate 54 includes a back side 62 having an array of external contacts 84, and a circuit side 64 having an array of die contacts 86. The external contacts 84 are arranged in a dense grid array and function as the terminal contacts for the package 50. The die contacts 86 are arranged in a pattern matching that of the bond pads 60 on the die 52, and function as bonding elements for the bond pads 60 for flip chip mounting the die 52 to the substrate 54.

Figure 1A:
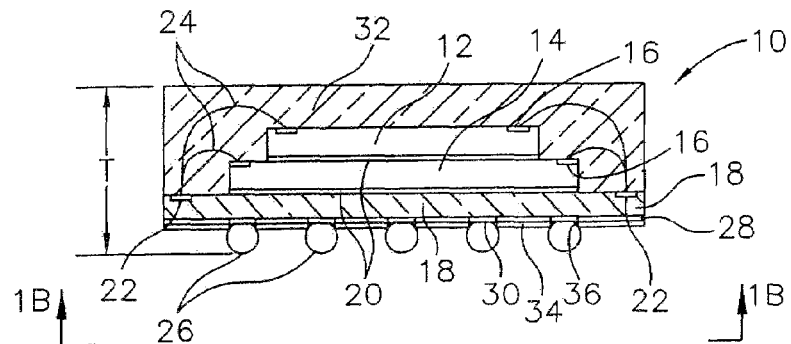
FIG. 1A is an enlarged schematic cross sectional view of a prior art BGA semiconductor package.
Figure 1B:
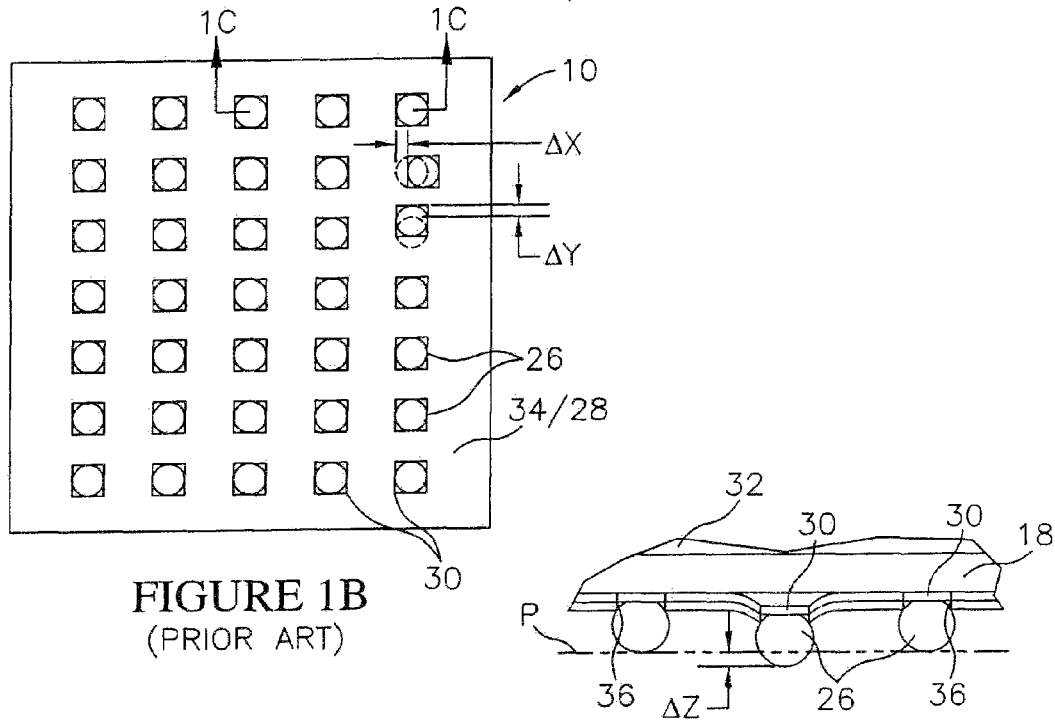
FIG. 1B is a view of the prior art BGA semiconductor package taken along section line 1B-1B of FIG. 1A.

As will be further explained, the external contacts 84 (and also the die contacts 86) comprise multi layered metal bumps rather than solder balls as with the prior art package 10 (FIG. 1A). Using the fabrication process to be hereinafter described, the external contacts 84 can be made with a smaller height H and a smaller width W relative to the external contacts 26 (FIG. 1A) of the prior art package 10 (FIG. 1A). Accordingly, an overall thickness T1 of the package 50 can be less than the overall thickness T (FIG. 1A) of the prior art package 10. A representative overall thickness T1 (FIG. 2A) of the package 50 can be from 0.1 mm to 1.4 mm.

Figure 2B:
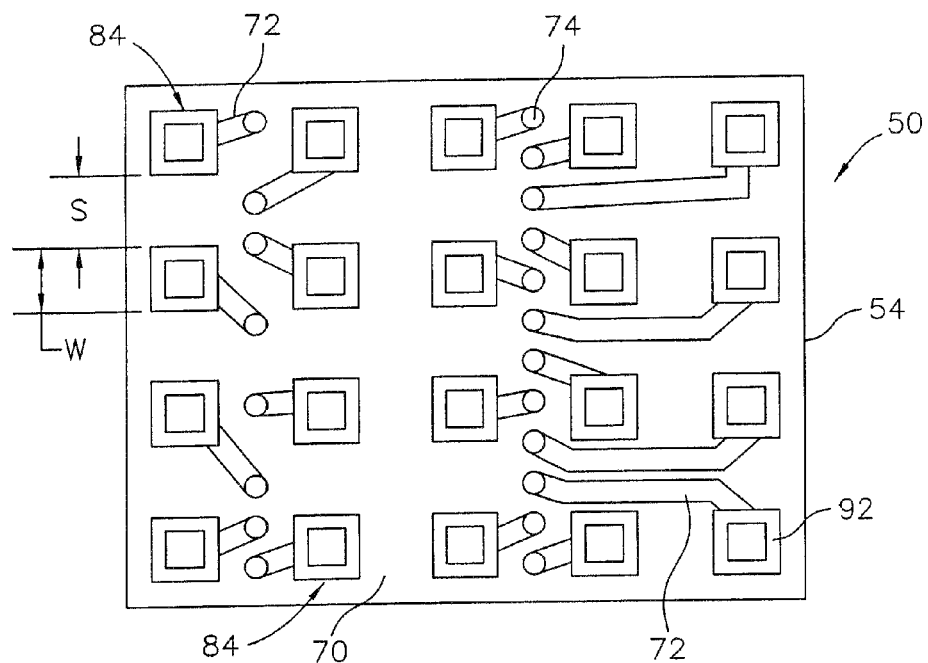
FIG. 2B is a view of the package taken along line 2B-2B of FIG. 2A.

As shown in FIG. 2B, the external contacts 84 can also be arranged in a dense grid pattern such as a grid array. Because of the reduced size of the external contacts 84, a spacing S between the external contacts 84 can be greater than a spacing of the external contacts 26 (FIG. 1A) of the prior art package 10. Accordingly, there is more room for the conductors 72 for the external contacts 26 and a signal density of the package 50 can be greater than the prior art package 10 (FIG. 1A).

Figure 2C:
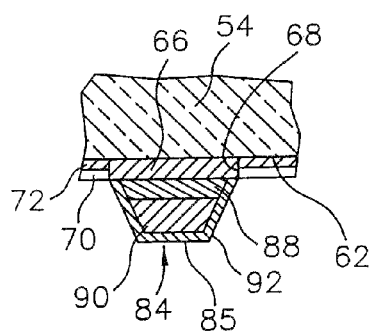
FIG. 2C is an enlarged portion of the package taken along line 2C of FIG. 2A.

The substrate 54 also includes a solder mask 70 on the back side 62 which provides electrical insulation for the external contacts 84. As shown in FIG. 2C, the solder mask 70 includes patterns of openings 68 containing bonding sites 66 for the external contacts 84. The bonding sites 66 are in electrical communication with patterns of conductors 72 on the back side 62 of the substrate 54 which provide signal paths for the external contacts 84. The substrate 54 also includes internal conductive vias 74 in electrical communication with the conductors 72 that provide signal paths through the substrate 54 to the die contacts 86.

Figure 2D:
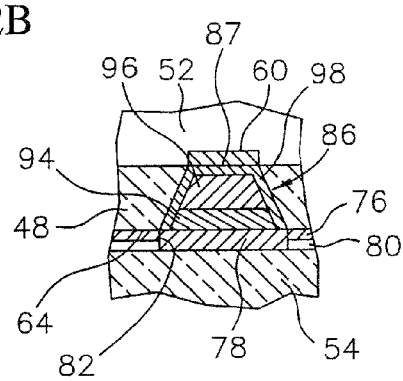
FIG. 2D is an enlarged portion of the package taken along line 2D of FIG. 2A.

As shown in FIG. 2D, the substrate 54 also includes a solder mask 80 on the circuit side 64 that provides electrical insulation for the die contacts 86. The solder mask 80 includes openings 82 which contain bonding sites 78 for the die contacts 86. The substrate 54 also includes patterns of conductors 76 on the circuit side 64 in electrical communication with the bonding sites 78 and with the conductive vias 74.

Preferably, the conductors 72, 76 and the bonding sites 66, 78 comprise a highly-conductive, easily-bondable metal such as copper. Preferably, the solder masks 70, 80 comprise a photoimageable dielectric material, such as a negative or positive tone resist, which can be blanket deposited to a desired thickness, then exposed and developed to form the openings 68, 82.

As shown in FIG. 2C, each external contact 84 includes a base layer 88 on a bonding site 66, a bump layer 90 on the base layer 88, and an outer layer 92 on the bump layer 90. Each external contact 84 is generally pyramidal in shape, and include a planar tip portion 85 (FIG. 2C). The planar tip portion 85 provides a relatively large planar area for bonding to mating electrodes 136 (FIG. 8B) of a supporting substrate 132 (FIG. 8B).

As shown in FIG. 2D, each die contact 86 also includes a base layer 94 on a bonding site 78, a bump layer 96 on the base layer 94, and an outer layer 98 on the bump layer 96. Each die contact 86 is generally pyramidal in shape, and include a planar tip portion 87 (FIG. 2D). The planar tip portion 87 provides a relatively large planar area for bonding to the bond pads 60 on the die 52.

The base layers 88, 94 can comprise a metal such as copper, that adheres to the bonding sites 66, 78, which preferably also comprises copper. Other suitable metals for the base layers 88, 94 include nickel, as well as any metal capable of deposition using conventional techniques with good adherence to the bonding sites 66, 78. The bump layers 90, 96 can comprise a metal such as nickel, that can be easily deposited to a desired thickness on the base layers 88, 94. Alternately the bump layers 90, 96 can comprise any metal that can be deposited using conventional techniques. The outer layers 92, 98 can comprise a non-oxidizing metal that will bond easily to mating electrodes on a supporting substrate (e.g., PCB). A preferred metal for the outer layers 92, 98 is gold. Other suitable metals for the outer layers 92, 98 include platinum, palladium, copper, nickel, tin.

Referring to FIGS. 3A-3I, steps in a method for fabricating the semiconductor package 50 (FIG. 2A) are illustrated schematically. Although the steps of the fabrication method are shown as being performed using a single substrate 54, it is to be understood that the steps can be performed at the same time on multiple substrates 54 to fabricate multiple semiconductor packages 50. For example, multiple substrates 54 can be contained on a panel similar to a lead frame, and the fabrication steps can be performed on all of the substrates 54 on the panel. As another alternative, multiple semiconductor dice 52 can be contained on a semiconductor wafer, and a wafer level fabrication process can be utilized to attach substrates 54 to the dice 52, and to form multiple semiconductor packages 50 at the same time. In either case, following the fabrication process the panel or the wafer can be singulated into individual semiconductor packages 50.

Figure 3A:
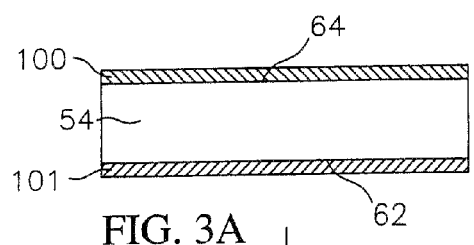
FIGS. 3A-3I are schematic cross sectional views illustrating process steps in a method for fabricating the package of FIG. 2A.

As shown in FIG. 3A, the substrate 54 can be initially provided with layers of copper foil 100, 101 laminated to the back side 62, and to the circuit side 64 thereof. The layers of copper foil 100, 101 can be laminated to the substrate 54 using a laminating press, or other suitable apparatus. The layers of copper foil 100, 101 can also include a plating layer (not shown), such as tin, or other suitable material, as is known in the art.

Preferably, the substrate 54 can be initially provided as a commercially produced bi-material core, such as a copper clad bismaleimide-trizine (BT) core, available from a commercial manufacturer such as Mitsubishi Gas Chemical Corp., Japan. A representative weight of the copper can be from 0.5 oz to 2 oz. per square foot. Besides bismaleimide-trizine (BT), other suitable materials for the substrate 54 include epoxy resins, (e.g., "FR-4" and "FR-5") and polyimide resins.

Figure 3B:
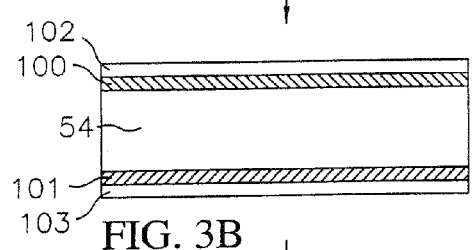

The substrate 54 can be formed with a required thickness (e.g., 0.2 mm to 1.6 mm), and then punched, machined, and otherwise formed with a required peripheral configuration and with required features. For example, openings (not shown) for the conductive vias 74 (FIG. 2A) can be drilled or laser machined in the substrate 54 and then plated with a conductive material to form the conductive vias 74. For simplicity, the openings are not shown in the substrate 54. Next, as shown in FIG. 3B, dry film photoresist layers 102, 103 can be laminated to the layers of copper foil 100, 101 on the back side 62, and on the circuit side 64 of the substrate 54. The dry film photoresist layers 102, 103 can comprise a multilayer organic composite comprising a flexible photoresist film between release and cover sheets. The dry film photoresist layers 102, 103 can be laminated to the layers of copper foil 100, 101 using a suitable apparatus, such as a roll laminator.

Figure 3C:
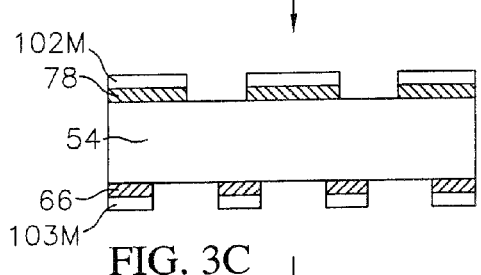

Next, as shown in FIG. 3C, the dry film photoresist layers 102, 103 can be exposed and developed to form etch masks 102M and 103M. Exposure and development of the dry film photoresist layers 102, 103 can be performed using equipment and techniques that are known in the art. The etch masks 102M, 103M can then be used with a suitable etchant to etch the layers of copper foil 100, 101. This etch step forms the bonding sites 78 on the circuit side 64, and the bonding sites 66 on the back side 62 of the substrate 54. In addition, the same etch step can be used to form the conductors 76 (FIG. 2D) in electrical communication with the bonding sites 78, and the conductors 72 (FIG. 2C) in electrical communication with the bonding sites 66. For simplicity, the conductors 72, 76 are not shown in FIG. 3C. Following the etch step, the masks 102M, 103M can be stripped from the substrate 54 using a suitable stripper.

Although a subtractive process (i.e., etching through the masks 102M, 103M) is illustrated to form the bonding sites 66, 78 and the conductors 72, 76, an additive process (i.e., deposition through a mask) can alternately be employed. In addition, although copper is a preferred material for the bonding sites 66, 78 and the conductors 72, 76, other suitable materials include aluminum, titanium, tungsten, tantalum, platinum, molybdenum, cobalt, nickel, gold and iridium.

Figure 3D:
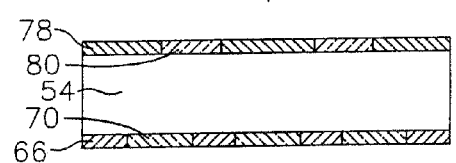

Next, as shown in FIG. 3D, the solder mask 80 can be formed on the circuit side 64, and the solder mask 70 can be formed on the back side 62 of the substrate 54. The solder masks 70, 80 can be formed using a suitable photoimageable resist that is exposed and developed in a required pattern. For simplicity, the solder masks 70, 80 are shown as being between the bonding sites 66, 78. However, in actual practice the solder masks 70, 80 can include the openings 68 (FIG. 2C) that align with the bonding sites 66, and the openings 82 (FIG. 2D) that align with the bonding sites 78. Also, the solder mask 70 can cover the conductors 72 (FIG. 2C), and the solder mask 80 can cover the conductors 76 (FIG. 2D).

Figure 3E:
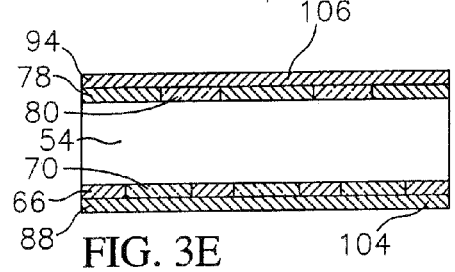

Next, as shown in FIG. 3E, a layer of copper 104 can be blanket deposited on the bonding sites 66 to form the base layers 88 for the external contacts 84 (FIG. 2C). At the same time, a layer of copper 106 can be blanket deposited on the bonding sites 78 to form the base layers 94 for the die contacts 86 (FIG. 2D). The layers of copper 104, 106 can also be deposited on the solder masks 70, 80 and will be removed later.

Figure 3F:
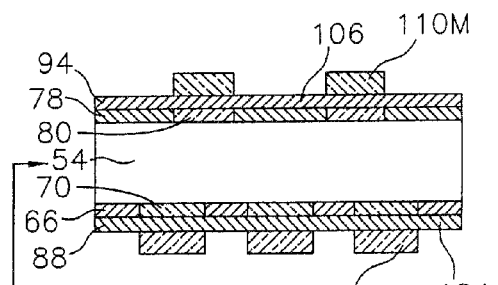

The layers of copper 104, 106 can be deposited to a thickness of about 5 μm to 200 μm using electroless deposition, followed by electrolytic deposition. Electroless deposition and electrolytic deposition can be performed using solutions, equipment and techniques that are known in the art. Although copper is a preferred metal for the base layers 88, 94, other suitable metals include nickel, gold tin as well as other depositable metals. Rather than electroless and electrolytic deposition, the layers of copper 104, 106 can be deposited using any suitable deposition process. Next, as shown in FIG. 3F, a dry film photoresist can be laminated to the layers of copper 104, then exposed and developed as previously described, to form a deposition mask 108M on the layer of copper 104, and a deposition mask 110M on the layer of copper 106.

Figure 3G:
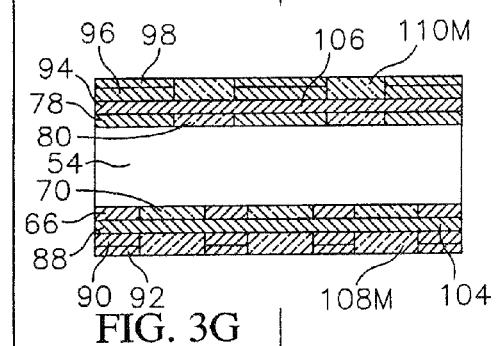

Next, as shown in FIG. 3G, the deposition mask 108M can be used to deposit the bump layers 90 (FIG. 3G), and the outer layers 92 (FIG. 3G) for the external contacts 84 (FIG. 2C). Similarly, the deposition mask 110M can be used to deposit the bump layers 96 (FIG. 3G) and the outer layers 98 (FIG. 3G) for the die contacts 86 (FIG. 2D). Either electroless or electrolytic deposition process can be used to deposit the bump layers 90, 96 and the outer layers 92, 98. In addition, techniques, solutions and equipment that are known in the art can be used to perform the deposition processes.

A representative thickness for the bump layers 90, 96 can be from 0.1 μm to 50 μm. A representative thickness for the outer layers 92, 98 can be from 0.05 μm to 10 μm. A preferred material for the bump layers 90, 96 is nickel. Other suitable materials for the bump layers 90, 96 include copper, nickel, gold, tin as well as other depositable metals. A preferred material for the outer layers 92, 98 is gold. Other suitable materials for the outer layers 92, 98 include copper, nickel, tin as well as other depositable metals.

Figure 3H:
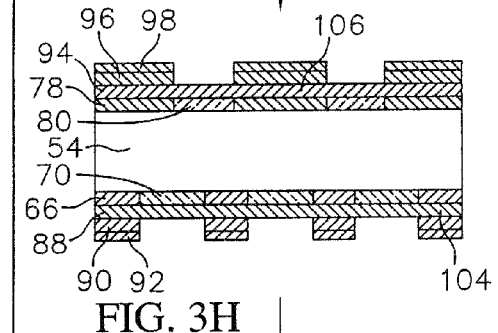

Next, as shown in FIG. 3H, the deposition masks 108M, 110M can be stripped using a suitable stripper.

Figure 3I:
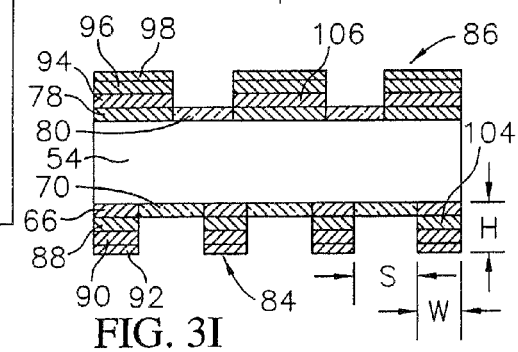

Next, as shown in FIG. 3I, the layer of copper 104, can be etched to remove the portions thereof on the solder mask 70. At the same time the layer of copper 106 can be etched to remove the portions thereof on the solder mask 80. This etch step can be performed using an etchant such as a solution of iron chloride, that selectively etches the layers of copper 104, 106 while the bump layers 90, 96 and outer layers 92, 98 remain unaffected.

Figure 1C:
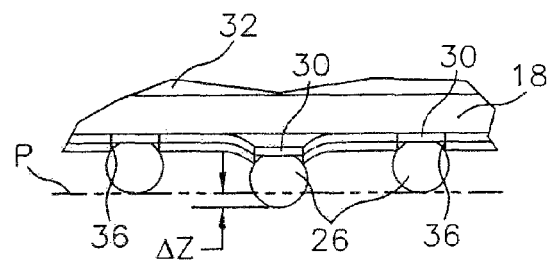
FIG. 1C is an enlarged cross sectional view taken along section line 1C-1C of FIG. 1B illustrating external contacts on the prior art BGA semiconductor package.
Figure 1D:
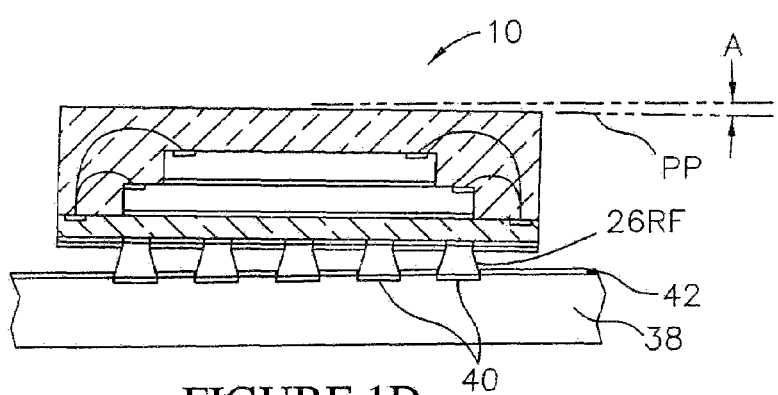
FIG. 1D is an enlarged schematic cross sectional view illustrating an electronic assembly constructed with the prior art BGA semiconductor package.

In addition, this etch step can be controlled to define the final shape of the external contacts 84 as generally pyramidal with planar tip portions 85 (FIG. 2C), and the final shape of the die contacts 86 as generally pyramidal with planar tip portions 87 (FIG. 2D). A height H of the external contacts 84 (and also the die contacts 86) can be from about 5 μm to any possible deposition height. This height H can be substantially less than the height of the external contacts 26 (FIG. 1C) made from conventional solder balls. A representative width W at the base of the external contacts (and also the die contacts 86) can be from 10 μm to any possible deposition width. This width can also be substantially less than a diameter of the external contacts 26 (FIG. 1C) made from conventional solder balls. A spacing S of the external contacts 84 can be selected as required and can be substantially larger than the spacing of the external contacts 26 (FIG. 1C) made from conventional solder balls.

Referring to FIG. 4, additional steps in the method for fabricating the semiconductor package 50 (FIG. 2A) are illustrated in a block diagram. Initially, as indicated by Block 1, a semiconductor wafer containing multiple semiconductor dice is provided, and a wafer mount step is performed to mount the wafer to a wafer dicing apparatus.

Next, as indicated by Block 2, a saw/dicing step is performed to singulate the wafer into individual dice, which include the die 52 (FIG. 2A).

Next, as indicated by Block 3, a flip die/thermocompression step is performed to mount the die 52 (FIG. 2A) to the substrate 54 (FIG. 2A). During this step, the bond pads 60 (FIG. 2A) on the die 52 are thermocompression bonded to the die contacts 86 (FIG. 2A) on the substrate 54. Conventional thermocompression bonding techniques and apparatus can be used to perform this step. In addition, the substrate 54 can be contained on a panel containing multiple substrates, such that multiple dice can be bonded form making multiple packages at the same time.

Next, as indicated by Block 4, an encapsulation step is performed to form the encapsulant 48 (FIG. 2A). The encapsulant can comprise a Novoloc epoxy resin molded using conventional equipment and techniques. In addition, the encapsulant 48 can be molded in a shape that forms a plastic body configured to encapsulate the die 52 and the bonded die contacts 86. Again the encapsulation step can be performed on a panel containing multiple substrates.

Next, as indicated by Block 5, a laser marking step is performed to mark the package 50 (FIG. 2A) with an identification number. For example, the identification number can be made on an exterior surface of the encapsulant 48.

Next, as indicated by Block 6, a singulation step is performed to singulate the completed package 50 from the strip.

Next, as indicated by Block 7, a module fabrication step is performed in which multiple packages 50 are used to fabricate a module to be hereinafter described.

FIG. 4A is a block diagram of a prior art method for fabricating the prior art package 10 (FIG. 1A). The present fabrication process eliminates the die lamination step (Block 3-FIG. 4A), and replaces a wire bonding step (Block 4) with the flip die/thermocompression step (Block 3-FIG. 4). In addition, a ball mount/reflow step (Block 7-FIG. 4A) for attaching solder balls to form the external contacts 26 (FIG. 1A) is eliminated.

Figure 5:
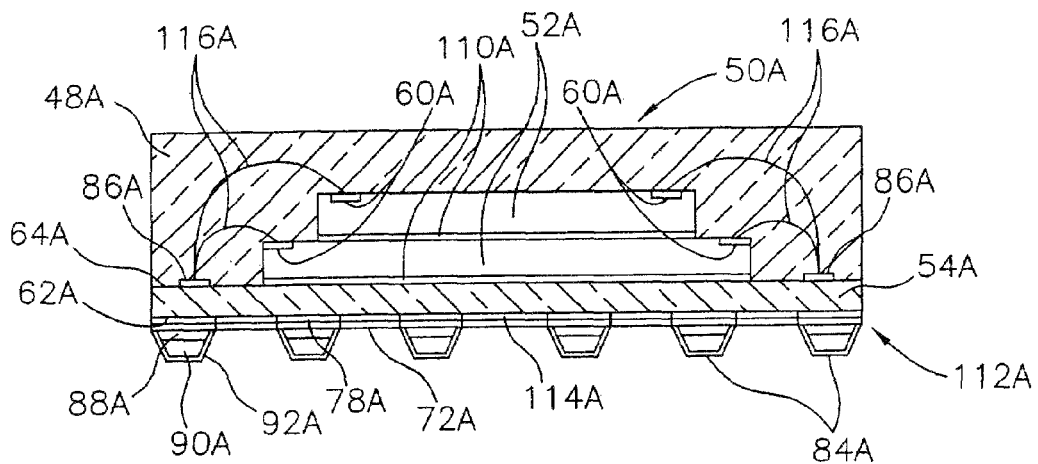
FIG. 5 is a schematic cross sectional view of an alternate embodiment semiconductor package constructed in accordance with the invention.

Referring to FIG. 5, a semiconductor package 50A constructed in accordance with a second embodiment of the invention is illustrated. The package 50A includes a substrate 54A having a circuit side 64A and a back side 62A. The package 50A also includes a stacked semiconductor die 52A back bonded to the circuit side 64A of the substrate 54A in a chip-on-board configuration. Adhesive layers 110A adhesively bond the stacked die 52A to the substrate 54A and also the separate dice of the stacked die 52A to one another.

The substrate 54A comprises a board material, such as bismaleimide-trizine (BT), substantially as previously described for the substrate 54. However, the substrate 54A also includes a flexible polymer substrate 112A adhesively bonded to the back side 62A of the substrate 54A. The polymer substrate 112A is similar in construction to multi layered TAB tape used in the art for various packaging applications. The polymer substrate 112A includes a polymer tape 114A made of a flexible polymer material, such as polyimide. In addition, the polymer substrate 112A includes bonding sites 78A and conductors 72A in electrical communication with the bonding sites 78A. The conductors 72A and bonding sites 78A are in electrical communication with conductive vias (not shown) in the substrate 54A, and with die contacts 86A on the circuit side 64A of the substrate.

The polymer substrate 112A also includes external contacts 84A on the bonding sites 78A. The external contacts 84A are configured substantially as previously described for external contacts 84 (FIG. 2C). As such, the external contacts 84A include base layers 88A, bump layers 90A and outer layers 92A, which are constructed substantially as previously described for base layers 88 (FIG. 2C), bump layers 90 (FIG. 2C) and outer layers 92 (FIG. 2C).

The package 50A also includes wires 116A wire bonded to the bond pads 60A on the stacked die 52A and to the die contacts 86A on the circuit side 64A of the substrate 54A. In addition, the package 50A includes an encapsulant 48A that forms a package body and encapsulates the stacked die 52A, the wires 116A, and the associated wire bonds on the bond pads 60A and on the die contacts 86A.

A method for fabricating the package 50A can include the following steps:

1. Initially the substrate 54A can be provided and the die contacts 86A formed on the circuit side 64A thereof using an etching process substantially as previously described for bonding sites 78 (FIG. 3C).

2. Next, the polymer substrate 112A can be provided. The polymer substrate 112A can be fabricated as a separate element that includes the polymer tape 114A, the conductors 72A, and the bonding sites 78A using techniques that are known in the art. In addition, the polymer substrate 112A can be adhered to the back side 62A of the substrate 54A using a suitable adhesive (not shown) with the conductors 72A and the bonding sites 78A in electrical communication with the die contacts 86A.

3. Next, the external contacts 84A can be formed on the bonding sites 78A as multi layer metal bumps using electroless and electrolytic deposition processes substantially as previously decried for external contacts 84.

4. Next, the stacked die 52A can be attached to the substrate 54A, and then wire bonded to the die contacts 86A using techniques and equipment that are known in the art.

5. Next, the encapsulant 48A can be molded to the substrate 54A using a conventional transfer molding process.

Figure 6:
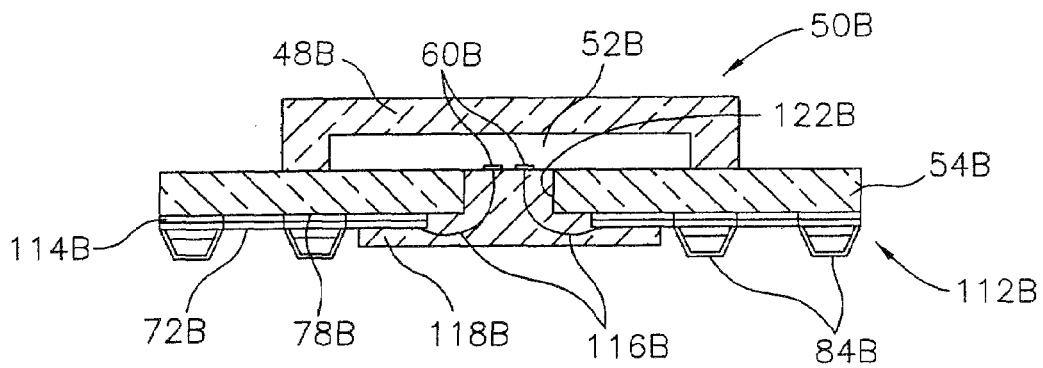
FIG. 6 is a schematic cross sectional view of an alternate embodiment semiconductor package constructed in accordance with the invention.

Referring to FIG. 6, a semiconductor package 50B constructed in accordance with a third embodiment of the invention is illustrated. The package 50B includes a substrate 54B and a semiconductor die 52B bonded face down to the substrate 54B in a board-on-chip configuration. Adhesive layers (not shown) adhesively bond the die 52B to the substrate 54B.

The substrate 54B comprises a board material, such as bismaleimide-trizine (BT), substantially as previously described for the substrate 54. In addition, the substrate 54B includes a flexible polymer substrate 112B adhesively bonded the substrate 54B. The polymer substrate 112B is constructed substantially as previously described for polymer substrate 112A. The polymer substrate 112B includes a polymer tape 114B made of a flexible polymer material, such as polyimide. In addition, the polymer substrate 112B includes bonding sites 78B and conductors 72B in electrical communication with the bonding sites 78B.

Wires 116B are bonded to the conductors 72B on the polymer substrate 112B, and to the bond pads 60B on the die 52B. The substrate 54B includes a bonding opening 122B aligned with the bond pads 60B and configured to provide access for the wires 116B. In addition, a glob top encapsulant 118B encapsulates the wires 116B and associated wire bonds.

The polymer substrate 112B also includes external contacts 84B on the bonding sites 78B. The external contacts 84B are configured substantially as previously described for external contacts 84 (FIG. 2C). The package 50B also includes an encapsulant 48B that forms a package body and encapsulates the die 52B.

A method for fabricating the package 50B can include the following steps:
 1. Initially the substrate 54B can be provided.
 2. Next, the polymer substrate 112B can be provided. The polymer substrate 112B can be fabricated as a separate element that includes the polymer tape 114B, the conductors 72B, and the bonding sites 78B using techniques that are known in the art. In addition, the polymer substrate 112B can be adhered the substrate 54B using a suitable adhesive (not shown).
 3. Next, the external contacts 84B can be formed on the bonding sites 78B as multi layer metal bumps using electroless and electrolytic deposition processes substantially as previously decried for external contacts 84.
 4. Next, the die 52B can be attached to the substrate 54B, and then wire bonded to the conductors 72B using techniques and equipment that are known in the art.
 5. Next, the encapsulant 48B can be molded to the substrate 54B using a conventional transfer molding process, and the glob top encapsulant 118B can be formed using a conventional glob top process.

Figure 7:
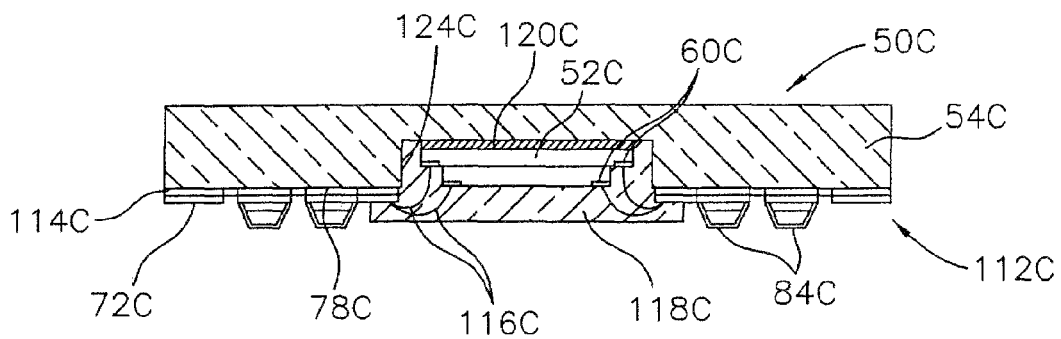
FIG. 7 is a schematic cross sectional view of an alternate embodiment semiconductor package constructed in accordance with the invention.

Referring to FIG. 7, a semiconductor package 50C constructed in accordance with a fourth embodiment of the invention is illustrated. The package 50C includes a substrate 54C having a recess 124C formed therein. In addition, the package 50C includes a stacked semiconductor die 52C, and a heat spreader 120C within the recess 124C. The heat spreader 120C is bonded to the back side of the stacked semiconductor die 52C and is also bonded to the substrate 54C.

The substrate 54C comprises a board material, such as bismaleimide-trizine (BT), substantially as previously described for the substrate 54. In addition, the substrate 54C includes a flexible polymer substrate 112C adhesively bonded the substrate 54C. The polymer substrate 112C is constructed substantially as previously described for polymer substrate 112A. The polymer substrate 112C includes a polymer tape 114C made of a flexible polymer material, such as polyimide. In addition, the polymer substrate 112C includes bonding sites 78C and conductors 72C in electrical communication with the bonding sites 78C.

The package 50C also includes wires 116C bonded to the conductors 72C on the polymer substrate 112C, and to the bond pads 60C on the stacked die 52C. In addition, a glob top encapsulant 118C encapsulates the wires 116C and associated wire bonds. The polymer substrate 112C also includes external contacts 84C on the bonding sites 78C. The external contacts 84C are configured substantially as previously described for external contacts 84 (FIG. 2C).

A method for fabricating the package 50C can include the following steps:
 1. Initially the substrate 54C can be provided.
 2. Next, the polymer substrate 112C can be provided. The polymer substrate 112C can be fabricated as a separate element that includes the polymer tape 114C, the conductors 72C, and the bonding sites 78C using techniques that are known in the art. In addition, the polymer substrate 112C can be adhered the substrate 54C using a suitable adhesive (not shown).
 3. Next, the external contacts 84C can be formed on the bonding sites 78C as multi layer metal bumps using electroless and electrolytic deposition processes substantially as previously decried for external contacts 84.
 4. Next, the heat spreader 120C and the die 52C can be attached to the substrate 54B within the recess 124C, and then wire bonded to the conductors 72C using techniques and equipment that are known in the art.
 5. Next, the glob top encapsulant 118C can be formed using a conventional glob top process.

Figure 8A:
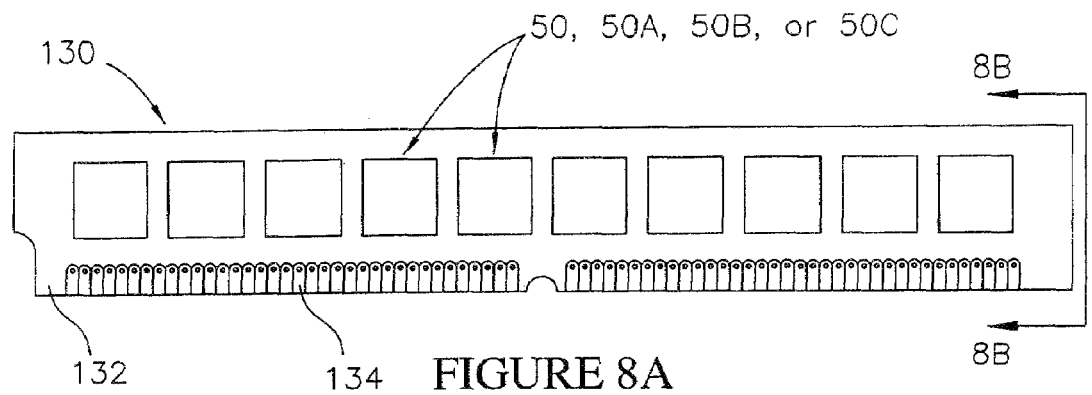
FIG. 8A is a plan view of an electronic assembly that includes semiconductor packages constructed in accordance with the invention.
Figure 8B:
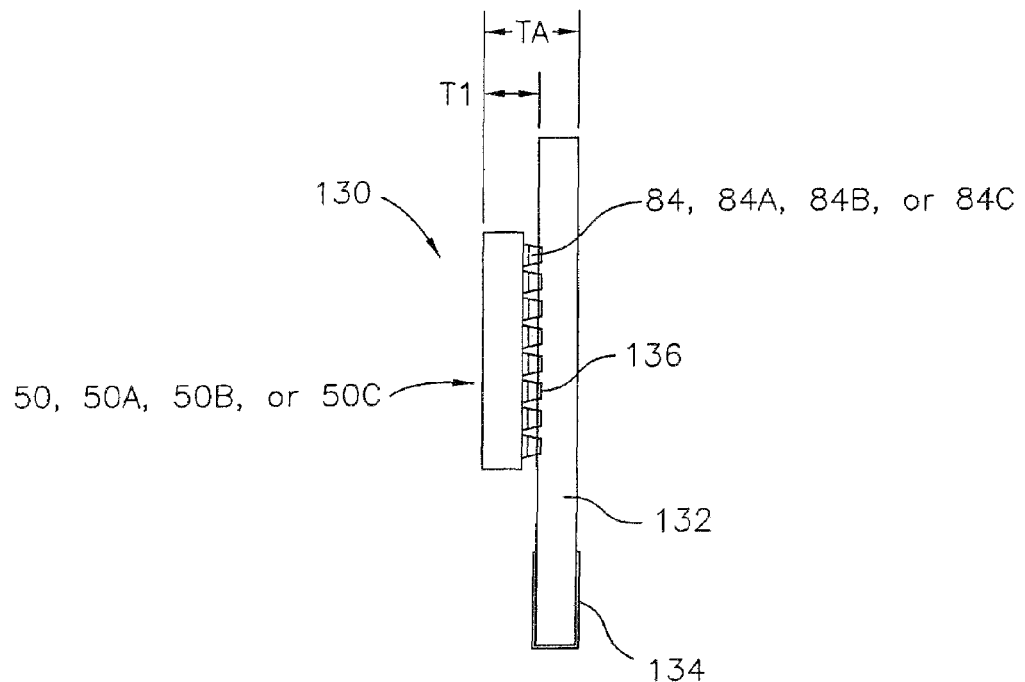
FIG. 8B is a side elevation view of the electronic assembly taken along line 8B-8B of FIG. 8A.

Referring to FIGS. 8A and 8B, an electronic assembly 130 constructed with a plurality of semiconductor packages 50, 50A, 50B or 50C is illustrated. In the illustrative embodiment the electronic assembly 130 comprises a multi chip module. However, other electronic assemblies can also be constructed using one or more of the semiconductor packages 50, 50A, 50B or 50C.

The assembly 130 includes a supporting substrate 132, and an edge connector 134 on the substrate 132. The substrate 132 also includes a plurality of electrodes 136 (FIG. 8B) in electrical communication with the edge connector 134. The semiconductor packages 50, 50A, 50B or 50C are mounted to the substrate 132 with the external contacts 84, 84A, 84B or 84C on the semiconductor packages 50, 50A, 50B or 50C bonded to the electrodes 136. Because the semiconductor packages 50, 50A, 50B or 50C have a reduced overall thickness T1 (profile), the assembly 130 also has a reduced thickness TA (profile).

Thus the invention provides an improved semiconductor package, a method for fabricating the package, and improved semiconductor assemblies constructed with the package. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor package comprising:
 providing a substrate having a first side, an opposing second side, a first bonding site on the first side and a second bonding site on the second side in electrical communication with the first bonding site;
 forming a mask on the second side;
 forming a first metal layer on the mask and on the second bonding site;
 forming a second metal layer on the first metal layer aligned with the second bonding site;
 forming a non-oxidizing third metal layer on the second metal layer;
 etching the first metal layer leaving a base metal layer on the second bonding site, the second metal layer on the base metal layer, and an outer layer on the second metal layer; and
 mounting a semiconductor die to the substrate in electrical communication with the first bonding site.

2. The method of claim 1 wherein the forming the first metal layer on the first bonding site step forms a die contact on the first side.

3. The method of claim 1 wherein the etching step forms an external contact for the package on the second side.

4. The method of claim 1 further comprising encapsulating the die on the substrate.

5. The method of claim 1 further comprising providing a plurality of first bonding sites and a plurality of second bonding sites in electrical communication with the first bonding sites, forming a plurality of first metal layers on the mask and the second bonding sites, forming a plurality of second metal layers on the first metal layers aligned with the second bonding sites, forming a plurality of non-oxidizing third metal layers on the second metal layers, and etching the first metal layers from the mask leaving the base metal layers on the second bonding sites, the second metal layers on the first metal layers and the third metal layers on the second metal layers.

6. The method of claim 1 wherein the die comprises a stacked die including a first die and a second die.

7. A method for fabricating a semiconductor package comprising:

provi ding a substrate having a first side and an opposing second side;

forming a first bonding site on the first side and a second bonding site on the second side in electrical communication with the first bonding site;

forming a mask on the second side;

forming a die contact on the first bonding site, forming an external contact on the second bonding site, the forming the external contact step comprising forming a first metal layer on the mask and the second bonding site, forming a second metal layer on the first metal layer aligned with the second bonding site, forming a non oxidizing third metal layer on the second metal layer, and etching the first metal layer from the mask leaving a base metal layer on the second bonding site, the second metal layer on the base metal layer and the third metal layer on the second metal layer; and mounting a semiconductor die to substrate in electrical communication with the die contact.

8. The method of claim 7 further comprising encapsulating the die in an encapsulant.

9. The method of claim 7 further comprising controlling the etching to define a shape of the external contact.

10. The method of claim 7 wherein a height of the external contact is about 5 μm and a width of the external contact is about 10 μm.

11. The method of claim 7 wherein a width of the external contact is less than about 0.012 inches.

12. The method of claim 7 wherein the mounting step comprises wire bonding, flip chip bonding or TAB bonding.

13. The method of claim 7 further comprising forming a plurality of die contacts identical to the die contact during the forming the die contact step and a plurality of external contacts identical to the external contact during the forming the external contact step.

14. The method of claim 7 further comprising performing the forming the die contact step and the forming the external contact step at a same time.

* * * * *